(12) United States Patent
Chiu et al.

(10) Patent No.: US 9,287,451 B2
(45) Date of Patent: Mar. 15, 2016

(54) LED DIE AND METHOD OF MANUFACTURING THE SAME

(71) Applicant: ADVANCED OPTOELECTRONIC TECHNOLOGY, INC., Hsinchu Hsien (TW)

(72) Inventors: Ching-Hsueh Chiu, Hsinchu (TW); Ya-Wen Lin, Hsinchu (TW); Po-Min Tu, Hsinchu (TW); Shih-Cheng Huang, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/466,033

(22) Filed: Aug. 22, 2014

(65) Prior Publication Data

US 2015/0054012 A1 Feb. 26, 2015

(30) Foreign Application Priority Data

Aug. 22, 2013 (CN) .................. 2013 1 03688377

(51) Int. Cl.

| H01L 21/00 | (2006.01) |
|---|---|
| H01L 21/20 | (2006.01) |
| H01L 33/22 | (2010.01) |
| H01L 33/12 | (2010.01) |
| H01L 33/32 | (2010.01) |
| H01L 33/00 | (2010.01) |
| H01L 33/10 | (2010.01) |

(52) U.S. Cl.
CPC .............. *H01L 33/22* (2013.01); *H01L 33/007* (2013.01); *H01L 33/12* (2013.01); *H01L 33/32* (2013.01); *H01L 33/10* (2013.01)

(58) Field of Classification Search
CPC ......... H01L 33/22; H01L 33/60; H01L 33/12; H01L 33/32; H01L 33/0075; H01L 2933/0091; H01L 2933/0058; H01L 21/00
USPC .............................. 257/98; 438/29, 478, 694
See application file for complete search history.

(56) References Cited

U.S. PATENT DOCUMENTS

| 8,212,266 | B2 * | 7/2012 | Lee et al. .......... 257/88 |
|---|---|---|---|
| 8,455,900 | B2 | 6/2013 | Wang |
| 8,723,159 | B2 | 5/2014 | Zhang et al. |
| 8,729,588 | B2 * | 5/2014 | Chen et al. ......... 257/98 |
| 8,816,321 | B2 | 8/2014 | Takeoka et al. |

(Continued)

FOREIGN PATENT DOCUMENTS

| CN | 103187495 A | 7/2013 |
|---|---|---|
| TW | 201242077 A1 | 10/2012 |

(Continued)

*Primary Examiner* — Amar Movva
*Assistant Examiner* — Sheikh Maruf
(74) *Attorney, Agent, or Firm* — Novak Druce Connolly Bove + Quigg LLP (57) ABSTRACT

An LED die includes a substrate, a first buffer layer, a second buffer layer, a plurality of nanospheres, a first semiconductor layer, an active layer and a second semiconductor layer. The first buffer layer, the second buffer layer, the first semiconductor layer, the active layer and the second semiconductor layer are formed successively on the substrate. The substrate has a plurality of protrusions on a surface thereof. The nanospheres are located on the protrusions and covered by the second buffer layer and located in the second buffer layer. The present disclosure also provides a method of manufacturing an LED die.

13 Claims, 10 Drawing Sheets

(56) References Cited

U.S. PATENT DOCUMENTS

| | | |
|---|---|---|
| 8,946,737 B2 | 2/2015 | Lin et al. |
| 2008/0251803 A1* | 10/2008 | Cho et al. .......................... 257/94 |
| 2008/0303047 A1* | 12/2008 | Shen et al. ........................ 257/98 |
| 2011/0089456 A1* | 4/2011 | Andrews et al. ................. 257/98 |
| 2013/0005060 A1* | 1/2013 | Lo et al. .......................... 438/29 |
| 2013/0128362 A1* | 5/2013 | Song et al. ..................... 359/601 |
| 2013/0161652 A1* | 6/2013 | Lin et al. ......................... 257/79 |
| 2015/0076505 A1* | 3/2015 | Ke et al. .......................... 257/76 |

FOREIGN PATENT DOCUMENTS

| | | |
|---|---|---|
| TW | 201304191 A1 | 1/2013 |
| TW | 201314947 A1 | 4/2013 |

* cited by examiner

LED DIE AND METHOD OF MANUFACTURING THE SAME

CROSS-REFERENCE TO RELATED APPLICATIONS

This application claims priority to Chinese Patent Application No. 201310368837.7 filed on Aug. 22, 2013 in the State Intellectual Property Office Of The P.R.C, the contents of which are incorporated by reference herein.

FIELD

The disclosure relates to an LED (light emitting diode) die and a method of manufacturing the LED die.

BACKGROUND

Crystal defects are generated during crystal growth, which has an effect for a performance of an LED die.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The only drawing is not necessarily to scale and the proportions of certain parts have been exaggerated to better illustrate details and features of the present disclosure.

Figure 1:
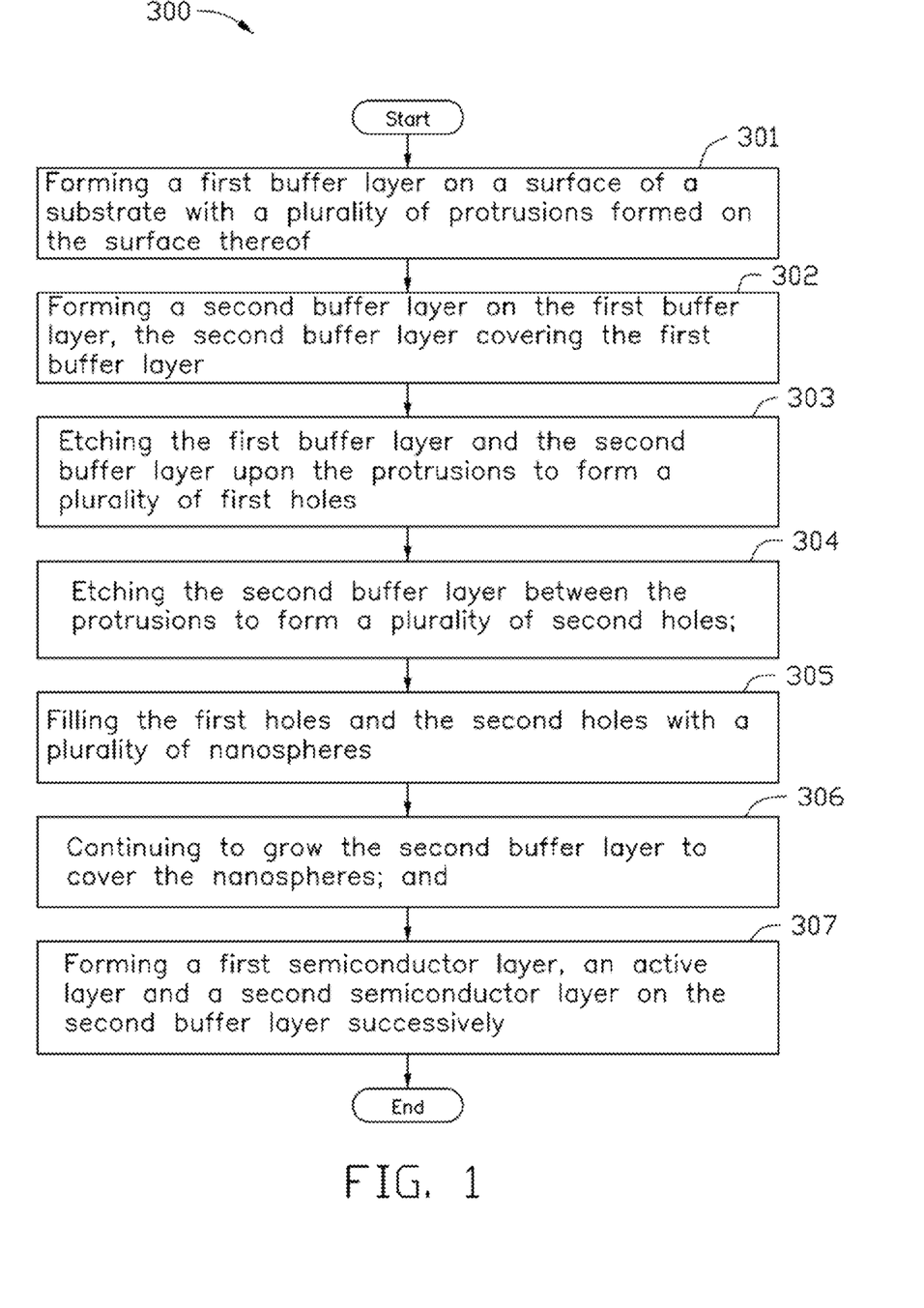
FIG. 1 is a flowchart of a method of manufacturing an LED die in accordance with an exemplary embodiment of the present disclosure.

Referring to FIG. 1, a flowchart is presented in accordance with an embodiment of a method of manufacturing an LED die. The method 300 is provided by way of example, as there are a variety of ways to carry out the method. The method 300 described below can be carried out using the configurations illustrated in FIGS. 2-9, for example, and various elements of these figures are referenced in explaining the method 300. Each block shown in FIG. 1 represents one or more process, method, or subroutines, carried out in the method 300. Furthermore, the illustrated order of blocks is illustrative only and the order of the blocks can be changed. Additional blocks can be added or fewer blocks may be utilized without departing from this disclosure. The method 300 can begin at block 301.

Figure 2:
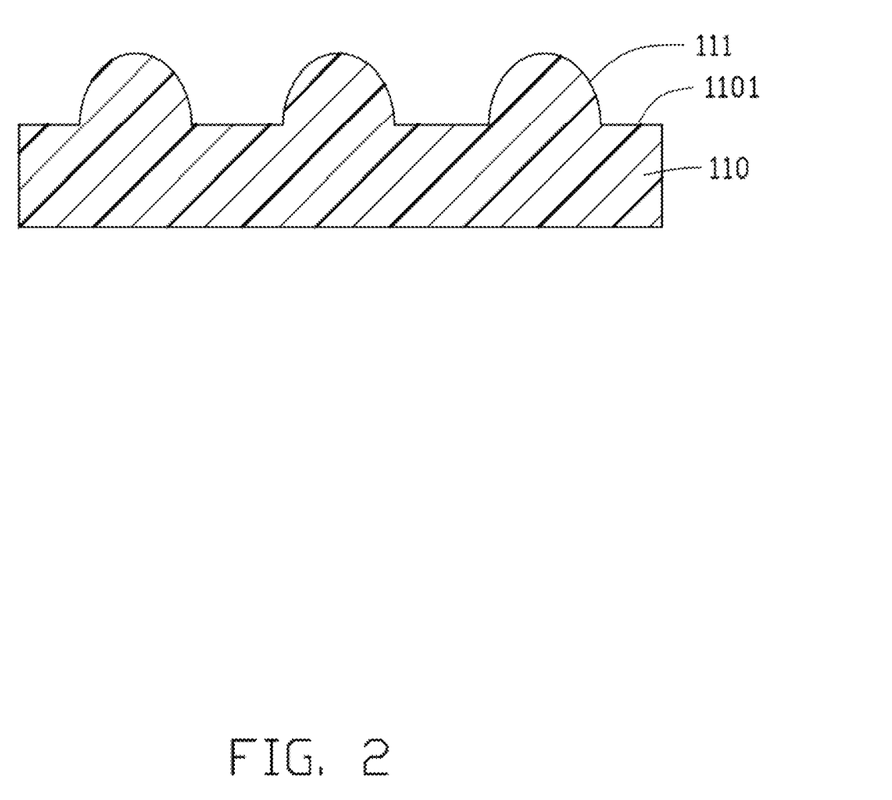
FIGS. 2-5 and 7-8 are cross-sectional views showing semi-finished LED dies processed by different steps of the method of FIG. 1 in accordance with an embodiment of the present disclosure.

At block 301, a first buffer layer 120 is formed on a surface 1101 of a substrate 110 with a plurality of protrusions 111 formed on the surface 1101 thereof.

The substrate 110 can be made of sapphire, silicon carbide (SiC), silicon (Si), gallium arsenide (GaAs), lithium metaaluminate ($LiAlO_2$), magnesium oxide (MgO), zinc oxide (ZnO), gallium nitride (GaN), aluminium nitride (AlN) or indium nitride (InN). In this embodiment, a cross section of each protrusion 111 can be arc-shaped. In other embodiments, the cross section of each protrusion 111 can be triangular, trapezoidal or other polygonal shapes.

The first buffer layer 120 can cover the surface 1101 of the substrate 110. The first buffer layer 120 can be a low-temperature un-doped GaN layer. The first buffer layer 120 can have a uniform thickness. According to the shape of the protrusion 111, part of the first buffer layer 120 also has an arc shape. In at least one embodiment, the thickness of the first buffer layer 120 can be from 20 nm to 30 nm. A range of temperature of growing the first buffer layer 120 can be from 500° C. to 600° C.

Figure 3:
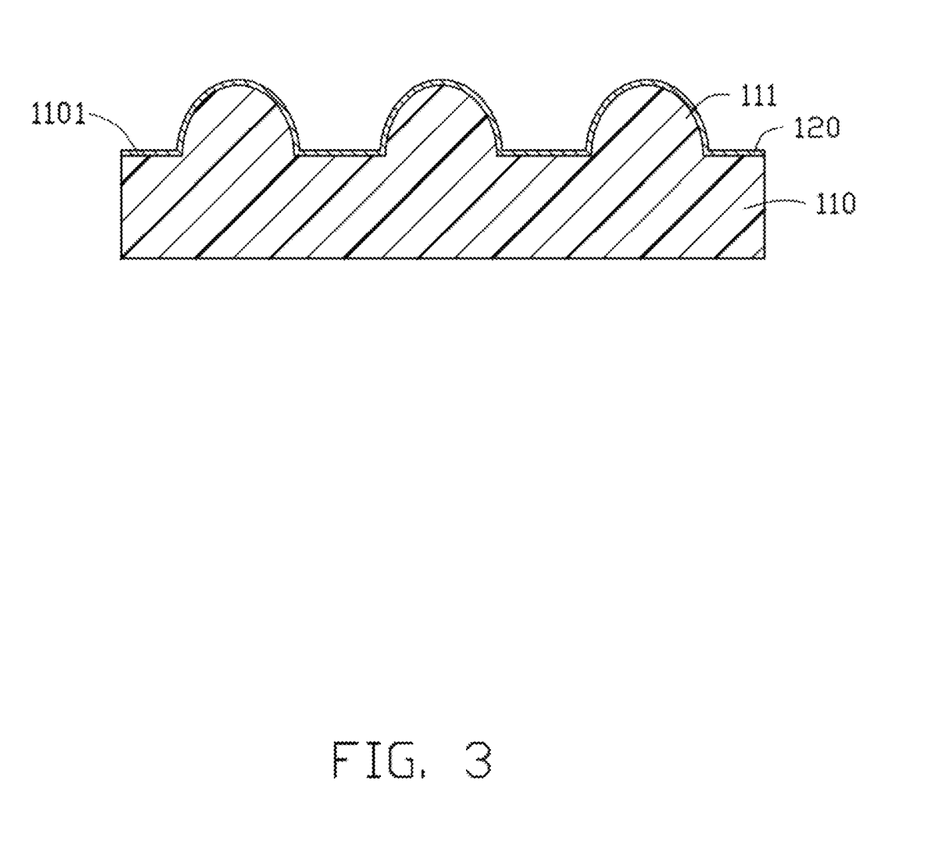

At block 302, a second buffer layer 121 is formed on the first buffer layer 120. The second buffer layer 121 covers the first buffer layer 120.

The second buffer layer 121 can be a high-temperature un-doped GaN layer. A range of temperature of growing the second buffer layer 121 can be from 1000° C. to 1100° C. The second buffer layer 121 includes a first part 1211 and a second part 1212. The first part 1211 is defined upon the protrusions 111. The second part 1212 is defined between the protrusions 111. It can be understood that crystal defects during crystal growth are easily generated in the first part 1211 and the second part 1212.

Figure 4:
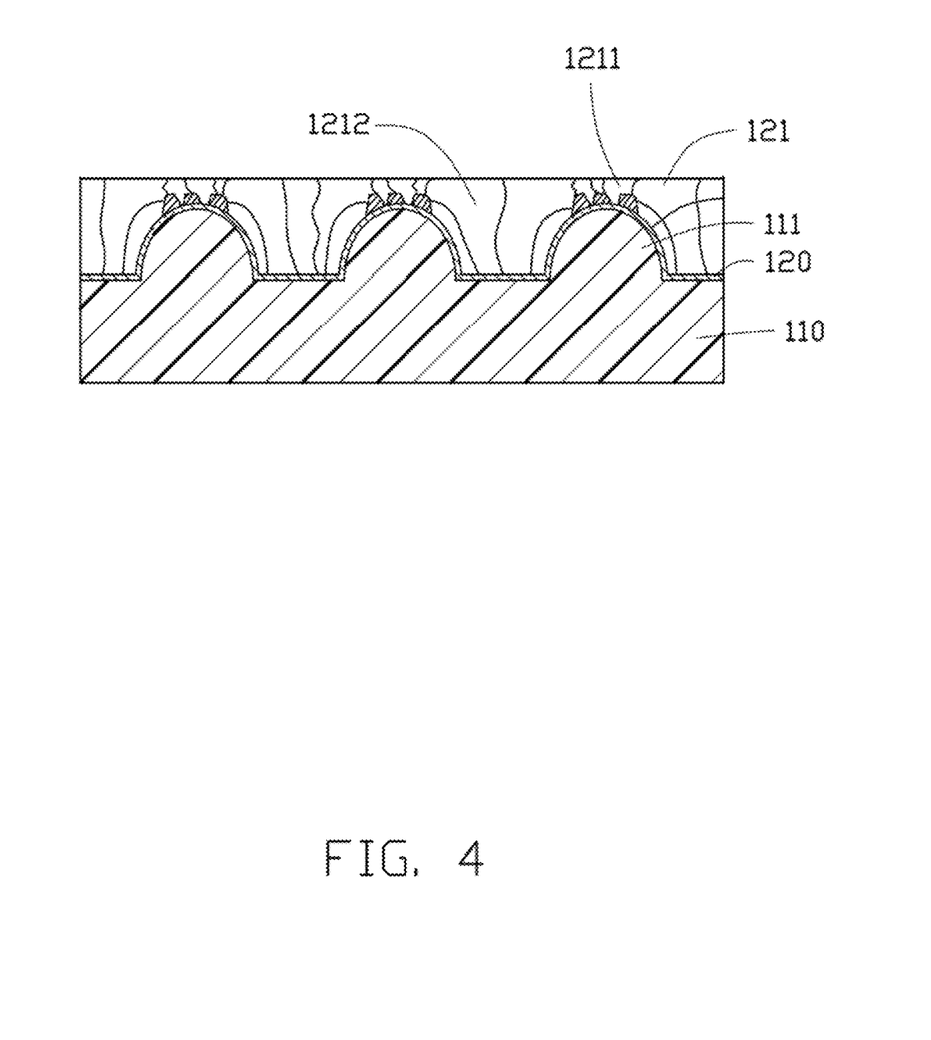

At block 303, the first buffer layer 120 and the second buffer layer 121 upon the protrusions 111 are etched to form a plurality of first holes 201. In at least one embodiment, the first part 1211 is etched to form the first holes 201. In at least one embodiment, a diameter of the first holes 201 can be from 0.5 μm to 2 μm. Furthermore, the diameter of the first holes 201 can be from 0.5 μm to 1 μm.

Figure 5:
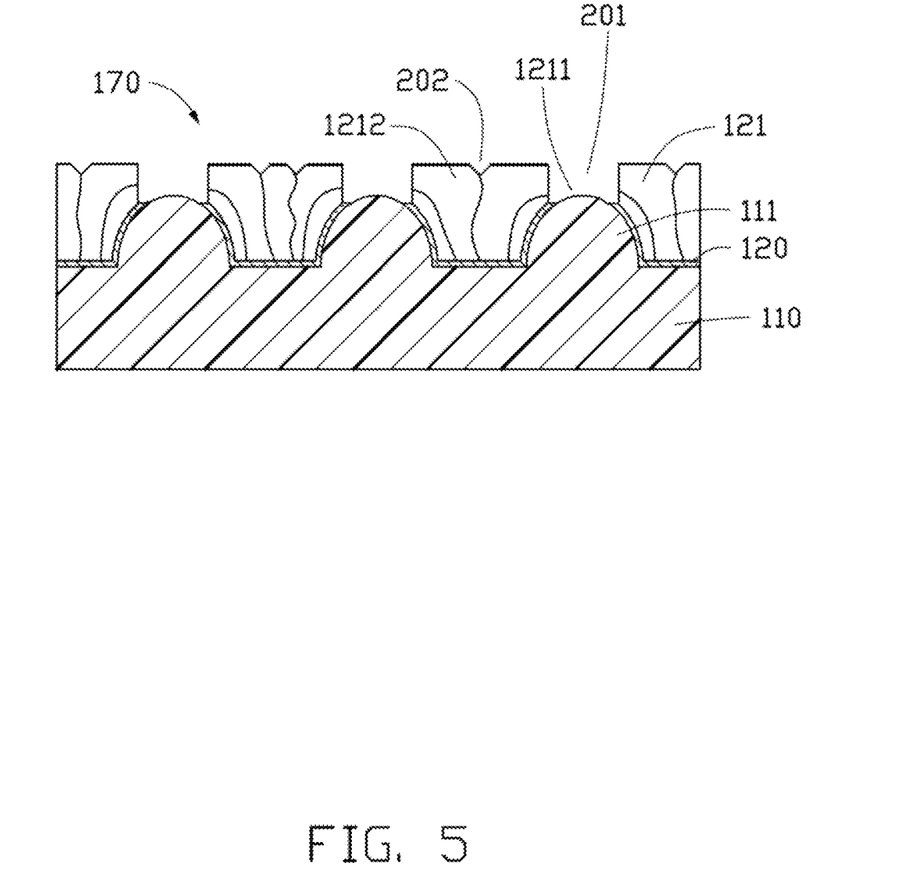
Figure 6:
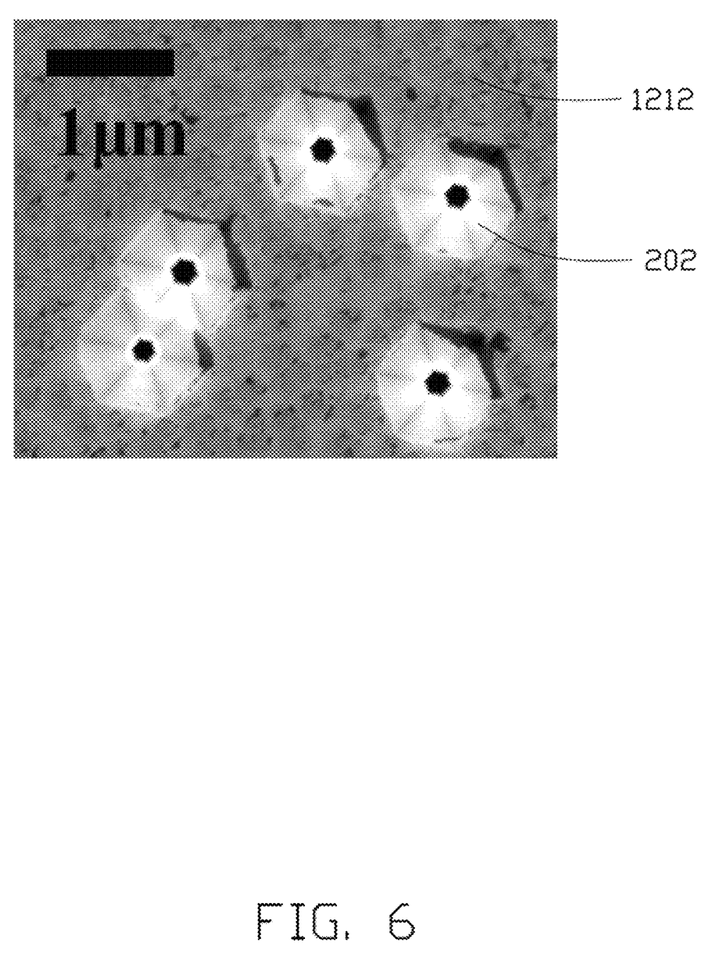
FIG. 6 is a scanning electron microscope (SEM) image of a second part after etched in FIG. 5.

At block 304, the second buffer layer 121 between the protrusions 111 is etched to form a plurality of second holes 202. In at least one embodiment, the second holes 202 can be defined on the second part 1212 of the second buffer layer 121. Each second hole 202 can be a hexagonal. In at least one embodiment, a diameter of the second holes 202 can be from 0.5 μm to 1 μm.

The first holes 201 and the second holes 202 can be etched by an etching solution. In at least one embodiment, the etching solution can be potassium hydroxide (KOH) solution. In other embodiments, the etching solution can be an oxalic acid (HOOCCOOH) or phosphoric acid ($H_3PO_4$) solution, etc.

Figure 7:
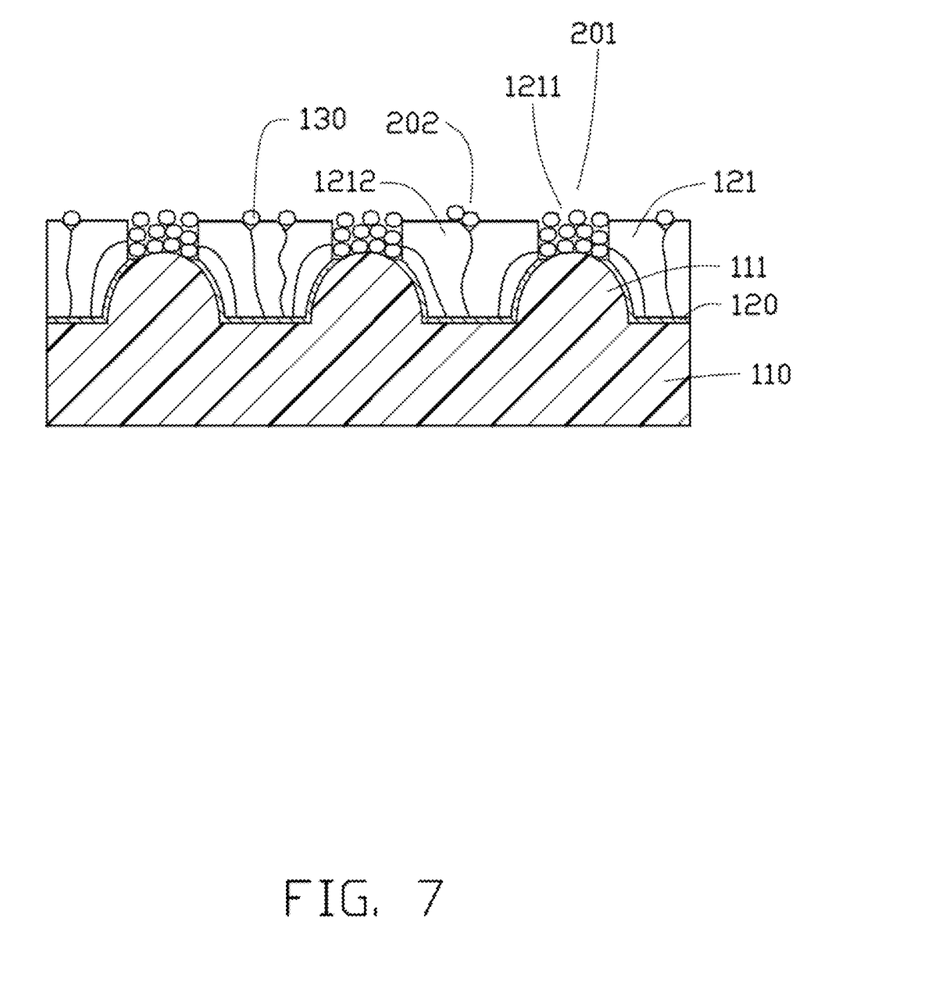

At block 305, the first holes 201 and the second holes 202 are filled with a plurality of nanospheres 130. The nanospheres 130 can be made of $SiO_2$. A diameter of nanospheres 130 can be from 0.3 μm to 1 μm. In at least one embodiment, the diameter of nanospheres 130 is from 0.4 μm to 0.6 μm.

In at least one embodiment, the nanospheres 130 can fill in the first holes 201 and the second holes 202 by the following steps: floating the nanospheres 130 on an organic solvent; dipping the semi-finished product 170 (see FIG. 5) into the same organic solvent; extracting the semi-finished product 170 from the organic solvent with the nanospheres 130 coated on the first holes 201 and the second holes 202; and removing the residual organic solvent on the semi-finished product 170.

The organic solvent can be made of methylbenzene. The organic solvent can be volatile.

Figure 8:
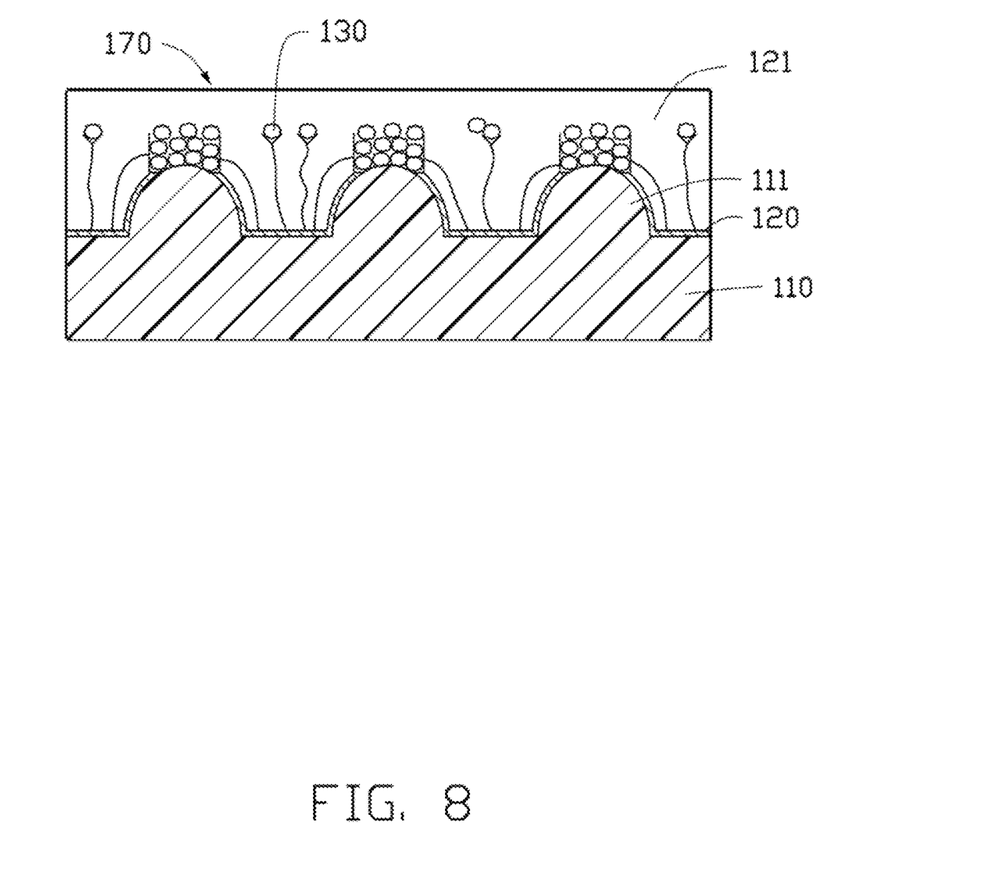

At block 306, the second buffer layer 121 can be grown continually to cover the nanospheres 130, and then the nanospheres 130 can be coated in the second buffer layer 121.

Figure 9:
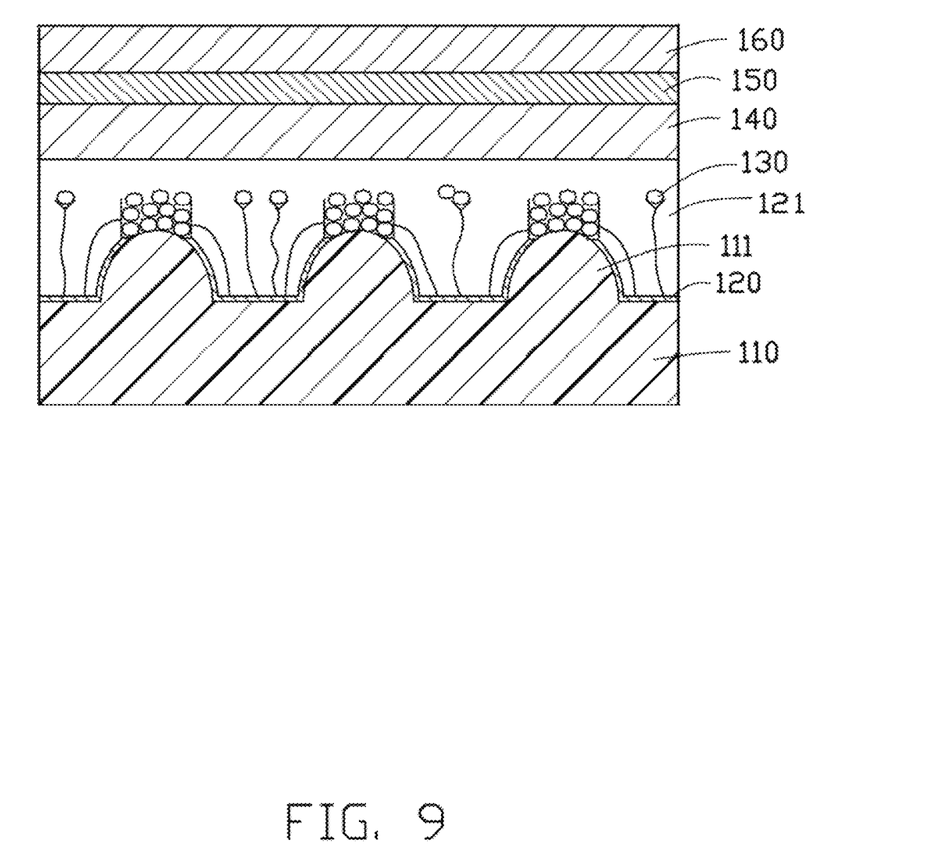
FIG. 9 is a cross-sectional view of the LED die obtained by the method of FIG. 1

At block 307, a first semiconductor layer 140, an active layer 150 and a second semiconductor layer 160 can be formed on the second buffer layer 121 successively. In this embodiment, the first semiconductor layer 140 is an N-type doped semiconductor layer, and the second semiconductor layer 160 is a P-type doped semiconductor layer. The active layer 150 is laminated on the first semiconductor layer 140. The active layer 150 may adopt a single quantum well structure, a multiple quantum well structure, or the like. In an alternative embodiment, the first semiconductor layer 140 and the second semiconductor layer 160 can be a P-type doped semiconductor layer and an N-type doped semiconductor layer, respectively.

Referring to FIG. 9, an LED die is also provided in the present disclosure. The LED die comprises a substrate 110, a first buffer layer 120, a second buffer layer 121, a plurality of nanospheres 130, a first semiconductor layer 140, an active layer 150 and a second semiconductor layer 160. The first buffer layer 120, the second buffer layer 121, the first semiconductor layer 140, the active layer 150 and the second semiconductor layer 160 are formed successively on the substrate 110. The substrate 110 has a plurality of protrusions 111 thereof. The nanospheres 130 are located on the first buffer layer 120 formed on the protrusions 111 and in the second buffer layer 121. The nanospheres 130 are coated in the second buffer layer 121.

The first buffer layer 120 is formed on the substrate 110. The first buffer layer 120 is a low-temperature un-doped GaN layer. The first buffer layer 120 has a uniform thickness. The thickness of the first buffer layer 120 can be from 20 nm to 30 nm. A range of temperature of growing the first buffer layer 120 can be from 500° C. to 600° C. The second buffer layer 121 is formed on the first buffer layer 120 and covers the first buffer layer 120. The second buffer layer 121 is a high-temperature un-doped GaN layer. A range of temperature of growing the second buffer layer 121 can be from 1000° C. to 1100° C. The nanospheres 130 are located on the first buffer layer 120 on the protrusions 111 and in the second buffer layer 121. The nanospheres 130 can be made of $SiO_2$. A diameter of nanospheres 130 can be from 0.3 μm to 1 μm. In at least one embodiment, the diameter of nanospheres 130 is from 0.4 μm to 0.6 μm.

Figure 10:
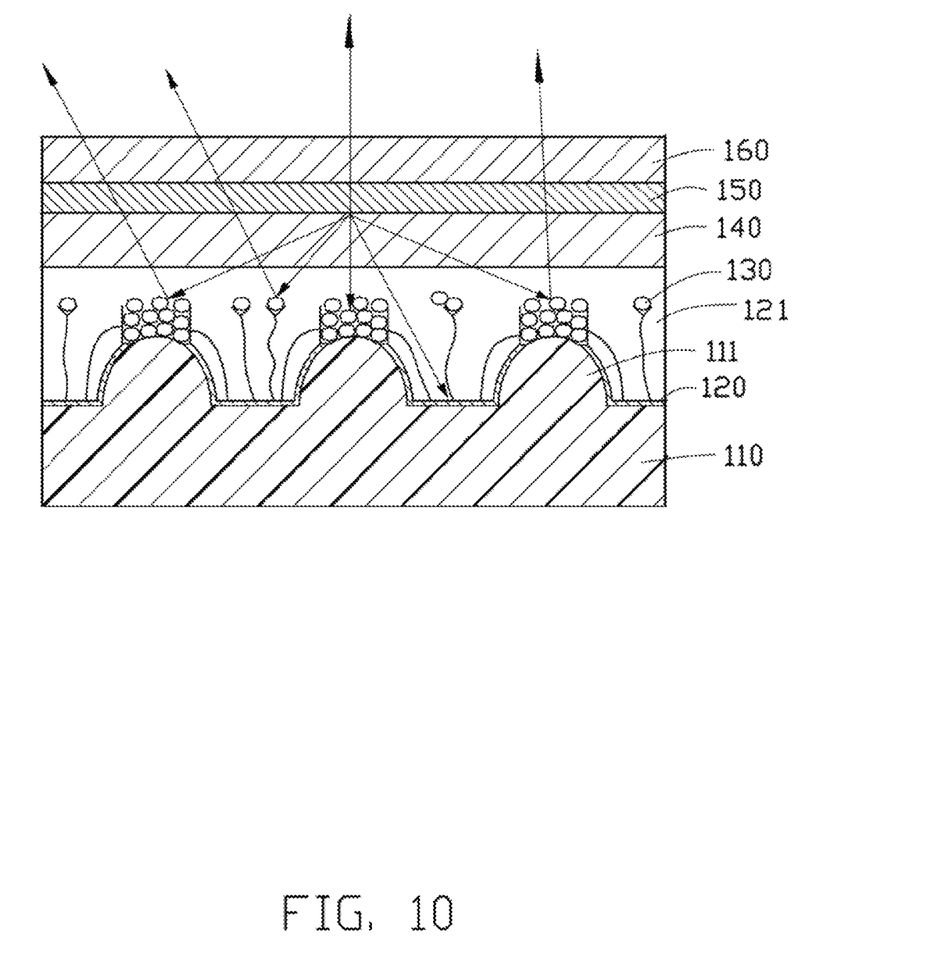
FIG. 10 is a cross-sectional view showing a light path diagram of the LED die obtained by the method of FIG. 1.

Referring to FIG. 10, light is emitted from the active layer 150. A part of the light emitted from the active layer 150 transmits through the second semiconductor layer 160 to reach the outer environment. Another part of the light emitted from the active layer 150 transmits through the first semiconductor 140 and the second buffer layer 121 to the nanospheres 130, is reflected by the nanospheres 130, and then transmits through the second buffer layer 121, the first semiconductor 140, the active layer 150 and the second semiconductor layer 160 to reach the outer environment. A third part of the light, which is minor, emitted from the active layer 150, transmits through the first semiconductor 140 and the second buffer layer 121, to reach the first buffer layer 120 and is absorbed by the first buffer layer 120.

It is to be further understood that even though numerous characteristics and advantages have been set forth in the foregoing description of embodiments, together with details of the structures and functions of the embodiments, the disclosure is illustrative only; and that changes may be made in detail, in matters of shape, size, and arrangement of parts within the principles of the disclosure to the full extent indicated by the broad general meaning of the terms in which the appended claims are expressed.

The embodiments shown and described above are only examples. Many details are often found in the art such as the other features of an LED die and a method of manufacturing the LED die. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A method of manufacturing an LED die comprising:
    forming a first buffer layer on a surface of a substrate with a plurality of protrusions formed on the surface thereof;
    forming a second buffer layer on the first buffer layer, the second buffer layer covering the first buffer layer;
    etching the first buffer layer and the second buffer layer upon the protrusions to form a plurality of first holes;
    etching the second buffer layer between the protrusions to form a plurality of second holes;
    filling the first holes and the second holes with a plurality of nanospheres;
    continuing to grow the second buffer layer to cover the nanospheres; and
    forming a first semiconductor layer, an active layer and a second semiconductor layer on the second buffer layer successively.

2. The method of claim 1, wherein the first buffer layer is a low-temperature un-doped GaN layer.

3. The method of claim 1, wherein the first buffer layer has a uniform thickness.

4. The method of claim 3, wherein the thickness of the first buffer layer is from 20 nm to 30 nm.

5. The method of claim 1, wherein the second buffer layer is a high-temperature un-doped GaN layer.

6. The method of claim 1, wherein the nanospheres are made of $SiO_2$.

7. The method of claim 1, wherein a diameter of nanospheres is from 0.3 μm to 1 μm.

8. The method of claim 1, wherein widths of the first holes are from 0.5 μm to 2 μm.

9. The method of claim 1, wherein widths of the second holes are from 0.5 μm to 1 μm.

10. The method of claim 1, wherein filling the first holes and the second holes with a plurality of nanospheres comprises:
    floating the nanospheres on an organic solvent;
    dipping a semi-finished product manufactured after etching the second buffer layer between the protrusions to form a plurality of second holes into the organic solvent;
    extracting the semi-finished product from the organic solvent; and
    removing the residual organic solvent on the semi-finish product.

11. The method of claim 10, wherein the organic solvent is methylbenzene.

12. The method of claim 10, wherein the organic solvent is volatile.

13. The method of claim 1, wherein each of the first holes have a top opening and a plane is defined at the top opening, the plane being coplanar to a plane formed at defined by top openings of the second holes.

* * * * *